United States Patent
Brintzinger et al.

(10) Patent No.: US 6,882,027 B2
(45) Date of Patent: Apr. 19, 2005

(54) METHODS AND APPARATUS FOR PROVIDING AN ANTIFUSE FUNCTION

(75) Inventors: Axel Brintzinger, Dresden (DE); Carl Radens, LaGrangeville, NY (US); William Tonti, Essex Junction, VT (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 69 days.

(21) Appl. No.: 10/447,018

(22) Filed: May 28, 2003

(65) Prior Publication Data

US 2004/0238919 A1 Dec. 2, 2004

(51) Int. Cl.⁷ .................................... H01L 29/00
(52) U.S. Cl. .............................. 257/530; 438/131
(58) Field of Search .................... 257/50, 530; 396/96, 396/225.7; 438/131, 467, 600, 957

(56) References Cited

U.S. PATENT DOCUMENTS

| | | | |
|---|---|---|---|
| 6,509,624 B1 | | 1/2003 | Radens et al. |
| 6,683,365 B1 | * | 1/2004 | Trivedi ........................ 257/530 |
| 6,713,839 B1 | * | 3/2004 | Madurawe ................... 257/530 |
| 2002/0094611 A1 | * | 7/2002 | Wu et al. .................... 438/131 |
| 2003/0201514 A1 | * | 10/2003 | Radens et al. .............. 257/530 |

* cited by examiner

*Primary Examiner*—Asok Kumar Sarkar
(74) *Attorney, Agent, or Firm*—Slater & Matsil, L.L.P.

(57) ABSTRACT

Methods and apparatus for providing an antifuse are disclosed, where the antifuse includes a semiconductor substrate having an active area circumscribed by a shallow trench isolation (STI) boundary; a gate conductor disposed above the semiconductor substrate and overlying at least a portion of the STI boundary; a dielectric disposed between the semiconductor substrate and the gate conductor; a first terminal coupled to the gate conductor; and a second terminal coupled to the semiconductor substrate, wherein a breakdown of the dielectric causes electrical connections between regions of the gate conductor and regions of the active area including substantially near the STI boundary.

11 Claims, 3 Drawing Sheets

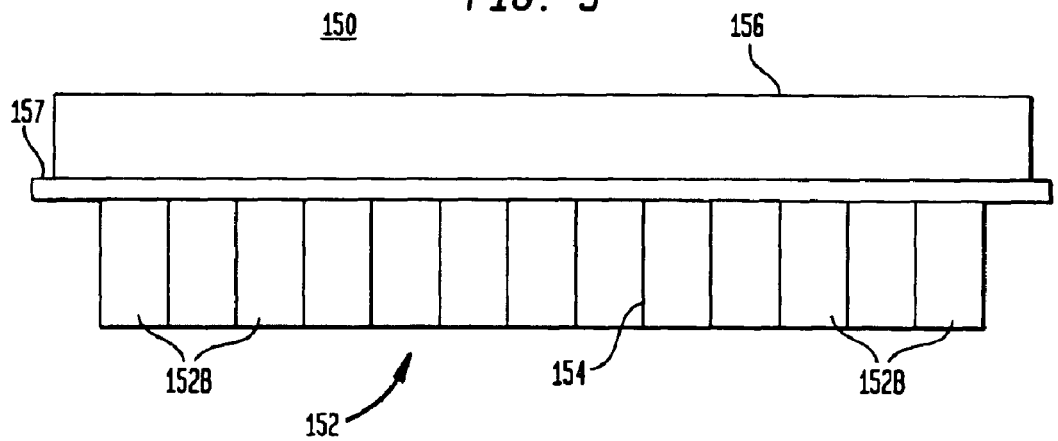
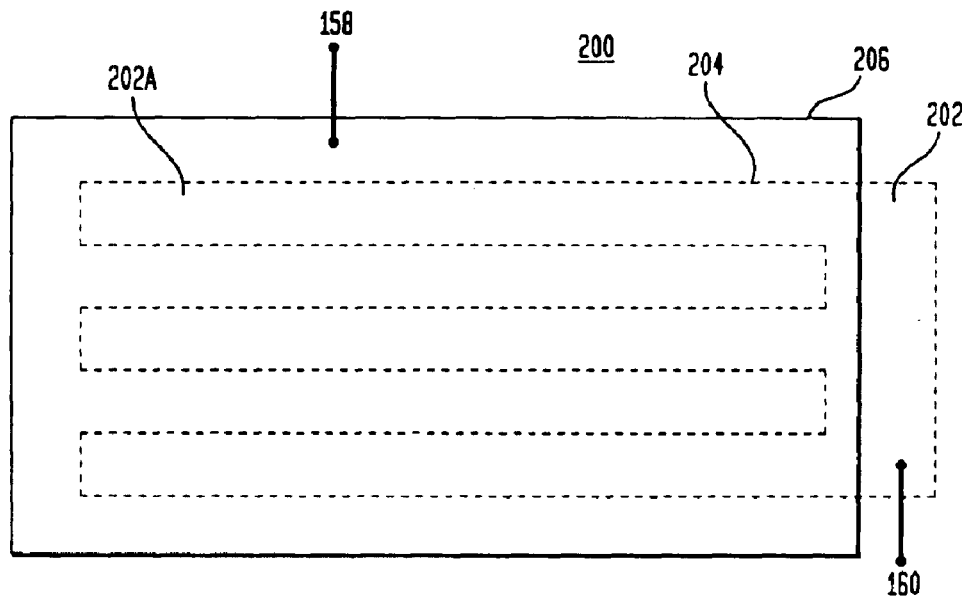

METHODS AND APPARATUS FOR PROVIDING AN ANTIFUSE FUNCTION

BACKGROUND OF THE INVENTION

The present invention relates to methods and apparatus for improving the resistance between a gate conductor and an active area of an antifuse programming elements.

In integrated circuit manufacturing, it is desirable to provide the ability to select various circuit components and/or circuits from an array. For example, redundant parallel circuits may be formed in an integrated circuit and, after testing a given circuit to ensure that it functions properly, the other parallel circuits may be removed. Conversely, a parallel circuit may also be added. While fuses are used to remove unwanted circuit components or circuits, antifuses are employed to add circuits or circuit components. Antifuse elements are normally electrically open, or non-conducting, and are programmable to permit a user to "blow" the element in order to create a useable short circuit.

Various conventional antifuses exist in the art in order to provide the ability to select circuits or circuit components as appropriate. Many of the conventional antifuses require the application of energy by means of external intervention in order to program the antifuse element. Antifuse elements that may be programmed (or blown) by applying an electrical voltage are desirable.

A conventional antifuse element may be formed utilizing a planar transistor structure, such as a MOSFET structure. The conventional antifuse construction includes a semiconductor substrate having an active area, a gate conductor disposed above the semiconductor substrate, and a dielectric insulator disposed between the semiconductor substrate and the gate conductor. When viewed from above, the active area is considerably larger than the gate conductor and the periphery of the gate conductor is contained entirely within the boundaries of the active area. The antifuse is programmed by applying a voltage potential of sufficient magnitude between the gate conductor and the active area of the semiconductor substrate to break down the dielectric.

The electrical resistance between the gate conductor and the active area of the semiconductor substrate of the conventional antifuse structure ranges from about 1 kOhm to about 100 kOhm. Unfortunately, this rather large range of resistance significantly reduces the fuse latch margin and results in an attendant poor performance. Accordingly, there are needs in the art for new methods and apparatus for providing an antifuse function that result in blown antifuse resistances of less than about 1 kOhm and/or that do not vary significantly.

SUMMARY OF THE INVENTION

In accordance with one or more aspects of the present invention, an antifuse structure includes: a semiconductor substrate having an active area circumscribed by a shallow trench isolation (STI) boundary; a gate conductor disposed above the semiconductor substrate and overlying at least a portion of the STI boundary; a dielectric disposed between the semiconductor substrate and the gate conductor; a first terminal coupled to the gate conductor; and a second terminal coupled to the semiconductor substrate. A breakdown of the dielectric causes electrical connections between regions of the gate conductor and regions of the active area including substantially near the STI boundary.

Preferably, the gate conductor completely overlies the active area of the semiconductor substrate. Alternatively, the gate conductor overlies only a portion of the active area of the semiconductor substrate.

Preferably, the active area of the semiconductor substrate as circumscribed by the STI boundary includes a longitudinal member and a plurality of finger portions extending transversely to the longitudinal member such that the gate conductor overlies at least a portion of at least some of the finger portions. The gate conductor may be substantially rectangular in shape.

The gate conductor may include a longitudinal member and a plurality of finger portions extending transversely to the longitudinal member. In this embodiment, the active area of the semiconductor substrate is preferably substantially rectangular in shape.

In accordance with one or more further aspects of the present invention, an antifuse includes: a semiconductor substrate having an active area circumscribed by a shallow trench isolation (STI) boundary, wherein the active area of the semiconductor substrate includes a longitudinal member and a plurality of finger portions extending transversely to the longitudinal member; a gate conductor having a longitudinal member and a plurality of finger portions extending transversely to the longitudinal member, wherein the gate conductor is disposed above the semiconductor substrate such that at least some of the finger portions of the gate conductor overly at least some portions of the STI boundary; a dielectric disposed between the semiconductor substrate and the gate conductor; a first terminal coupled to the gate conductor; and a second terminal coupled to the semiconductor substrate. A breakdown of the dielectric causes electrical connections between regions of the gate conductor and regions of the active area including substantially near the STI boundary.

In accordance with one or more further aspects of the present invention, a method of forming an antifuse includes: forming a semiconductor substrate having an active area circumscribed by a shallow trench isolation (STI) boundary;
 disposing a dielectric on or above the semiconductor substrate; forming a gate conductor on or above the dielectric and above the semiconductor substrate such that it overlies at least a portion of the STI boundary; coupling a first terminal to the gate conductor; and coupling a second terminal to the semiconductor substrate.

A breakdown of the dielectric causes electrical connections between regions of the gate conductor and regions of the active area including substantially near the STI boundary. The method may include forming the gate conductor such that it completely overlies the active area of the semiconductor substrate. Alternatively, the method may include forming the gate conductor such that it overlies only a portion of the active area of the semiconductor substrate.

The step of forming the active area of the semiconductor substrate may include forming a longitudinal member and a plurality of finger portions extending transversely to the longitudinal member; and the step of forming the gate conductor may include ensuring that the gate conductor overlies at least a portion of at least some of the finger portions. In this embodiment the step of forming the gate conductor may include ensuring that the gate conductor is substantially rectangular in shape.

The step of forming the gate conductor may include forming a longitudinal member and a plurality of finger portions extending transversely to the longitudinal member. In this embodiment, the step of forming the active area of the semiconductor substrate may include ensuring that the active area is substantially rectangular in shape.

In accordance with one or more further aspects of the present invention, a method of forming an antifuse includes forming a semiconductor substrate having an active area circumscribed by a shallow trench isolation (STI) boundary, wherein the active area of the semiconductor substrate includes a longitudinal member and a plurality of finger portions extending transversely to the longitudinal member; disposing a dielectric on or above the semiconductor substrate; forming a gate conductor having a longitudinal member and a plurality of finger portions extending transversely to the longitudinal member, such that the gate conductor is disposed on or above the dielectric and above the semiconductor substrate, and such that at least some of the finger portions of the gate conductor overly at least some portions of the STI boundary; coupling a first terminal to the gate conductor; and coupling a second terminal to the semiconductor substrate.

Other aspects, features, advantages, etc. of the present invention will become evident to one skilled in the art when the description herein is taken in conjunction with the accompanying drawings.

BRIEF DESCRIPTION OF THE DRAWINGS

For the purposes of illustrating the invention, there are shown in the drawings forms that are presently preferred, it being understood, however, that the invention is not limited to the precise arrangements and/or instrumentalities shown.

FIG. 3 is a side sectional view taken through line 3—3 of FIG. 2;

FIG. 4 is a top view of an antifuse element in accordance with one or more further aspects of the present invention;

DETAILED DESCRIPTION OF THE PREFERRED EMBODIMENTS

Figure 1:
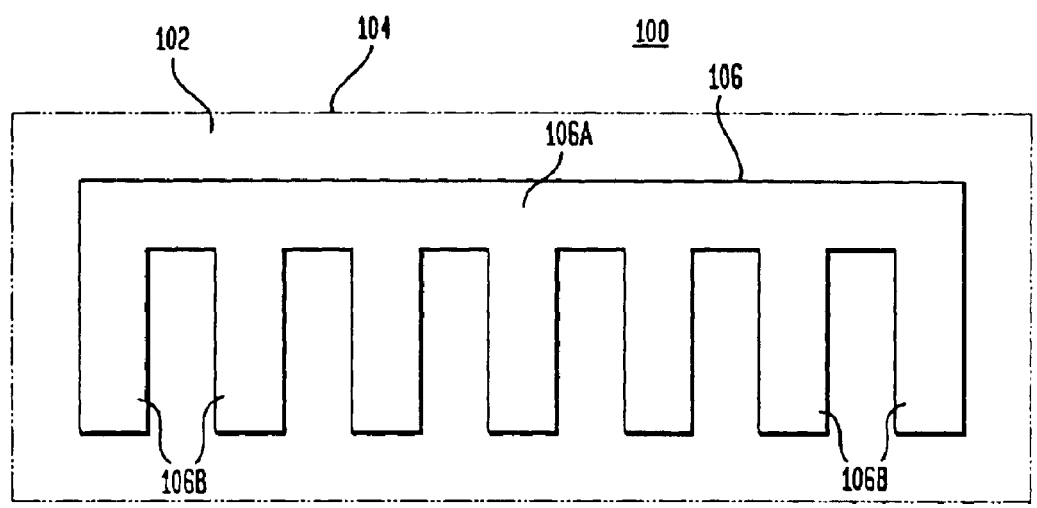
FIG. 1 is a top view of an antifuse element 100.

Referring now to the drawings wherein like numerals indicate like elements, there is shown in FIG. 1 a top view of an antifuse element 100. The antifuse element 100 includes a substrate having an active area 102 that is circumscribed by a shallow trench isolation (STI) boundary 104. A gate conductor 106 is disposed above the semiconductor substrate and entirely within the STI boundary 104. A dielectric layer (not shown) is disposed between the active area 102 of the semiconductor substrate and the gate conductor 106. Although not shown, a first terminal is coupled to the gate conductor 106 and a second terminal is coupled to the active area 102 of the semiconductor substrate. When an external voltage is applied between the gate conductor 106 and the active area 102 of the semiconductor substrate, the dielectric layer breaks down and one or more electrical connections between the gate conductor 106 and the active area 102 of the semiconductor substrate are obtained.

In this embodiment, the gate conductor 106 includes a longitudinal member 106A and a plurality of finger portions 106B extending transversely to the longitudinal member 106A. It is significant to note that the perimeter of the gate conductor 106 is contained entirely within the STI boundary 104 of the active area 102 when viewed from above as is the case in FIG. 1. Resultantly, the blown antifuse resistance between the first terminal of the gate conductor 106 and the second terminal of the active area 102 will vary widely between about 1 kOhm and about 100 kOhm.

While the present invention is not limited to any theory of operation, it has been discovered that when a dielectric breakdown between a gate conductor and an active area of a substrate substantially near the STI boundary occurs, a low resistance path is developed. Through experimentation, this discovery has been developed to significantly improve the blown antifuse resistance by providing opportunities for dielectric breakdown near the STI boundary, reducing the blown resistance, and reducing variations in the blown resistance.

Figure 2:
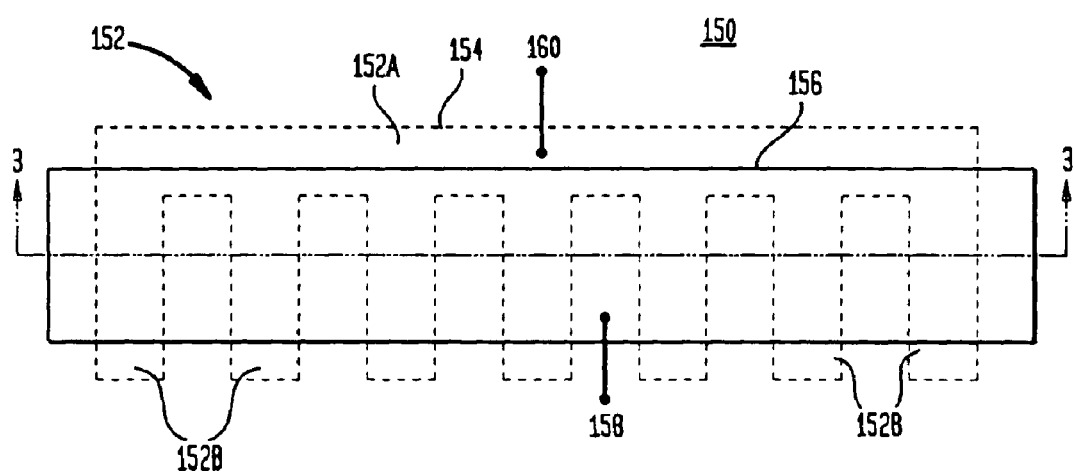
FIG. 2 is a top view of an antifuse element in accordance with one or more aspects of the present invention.

FIG. 2 is a top view of an antifuse element 150 in accordance with one or more aspects of the present invention. FIG. 3 is a side sectional view of the antifuse element 150 of FIG. 2 taken through line 3—3. The antifuse element 150 includes a semiconductor substrate having an active area 152 that is circumscribed by an STI boundary 154 shown in dashed line. The active area 152 includes a longitudinal member 152A and a plurality of finger portions 152B extending transversely to the longitudinal member 152A. The antifuse element 150 also includes a gate conductor 156 disposed above the active area 152 of the semiconductor substrate. A dielectric layer 157 (FIG. 3) is disposed between the active area 152 of the semiconductor substrate and the gate conductor 156. Significantly, the gate conductor 156 overlies at least a portion of the STI boundary 154. In this embodiment, the respective lengths of portions of the STI boundary 154 circumscribing the finger portions 152B of the active area 152 are beneath the gate conductor 156.

A first terminal 158 is coupled to the gate conductor 156 and a second terminal 160 is coupled to the active area 152 of the semiconductor substrate. In accordance with an important aspect of the present invention, when a voltage is applied between the first and second terminals 158, 160 and the dielectric layer 157 breaks down, electrical connections are developed between regions of the gate conductor 156 and regions of the active area 152 of the semiconductor substrate that are substantially near the STI boundary 154. These electrical connections are of relatively low resistance as compared to the high resistance paths that will develop at regions away from the STI boundary 154. Advantageously, the transversely extending finger portions 152B of the active area 152 provide for a relatively large aggregate of the STI boundary 154 lying below the gate conductor 156. This increases the number of electrical connections between the gate conductor and the active area 152 occurring near the STI boundary 154.

It is noted that the active area 152 of the semiconductor substrate may be formed from any single crystal silicon, and may be of the bulk silicon or SOI types. The dielectric layer 157 may be formed from silicon nitride, such as a stoichiometric silicon nitride film, $Si_3N_4$, or it may be a non-stoiciometric combination of silicon and nitride. Alternatively, the dielectric layer 157 may be a silicon oxynitride, $SiO_xN_y$, film. The dielectric layer 157 may also be formed from any other thin dielectric film, such as oxides doped with arsenic, boron, or phosphorous, or other materials, such as amorphous carbon, hydrogen containing amorphous carbon, etc. The gate conductor 156 may be formed from polysilicon including a dopant in accordance with conventional techniques.

With reference to FIG. 4, an alternative antifuse structure 200 in accordance with one or more further aspects of the present invention is illustrated. The antifuse structure 200 includes a semiconductor substrate having an active area 202 circumscribed by an STI boundary 204, a gate conductor 206 disposed above the active area 202, and a dielectric layer (not shown) therebetween. In many ways, the antifuse structure 200 is substantially similar to the antifuse structure 150 of FIG. 2. The active area 202 of the semiconductor substrate of the antifuse structure 200 differs from that of the antifuse structure 150 of FIG. 2 in that a fewer number of finger portions 202A are employed, and the finger portions 202A are substantially longer than the finger portions 152B of FIG. 2. This changes the aspect ratio of the active area 202, while maintaining the advantageous feature of ensuring that substantial portions of the STI boundary 204 are beneath the gate conductor 206. In this embodiment, both inside and outside corners of the finger portions 202A are disposed beneath the gate conductor 206.

Figure 5:
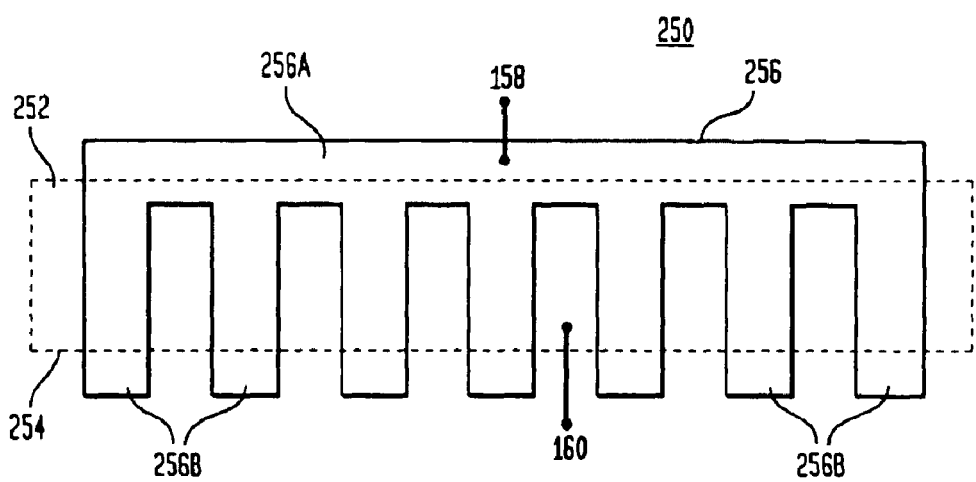
FIG. 5 is a top view of an antifuse element in accordance with one or more still further aspects of the present invention.

FIG. 5 illustrates an alternative antifuse structure 250 in accordance with one or more further aspects of the present invention. The antifuse structure 250 includes an active area 252 circumscribed by an STI boundary 254. The antifuse structure 250 also includes a gate conductor 256 disposed above the active area 252 of the semiconductor substrate, and a dielectric layer (not shown) is disposed between the gate conductor 256 and the active area 252 of the semiconductor substrate. The gate conductor includes a longitudinal member 256A and a plurality of finger portions 256B extending transversely from the longitudinal member 256A. The advantage of having the finger portions 256B extending from the longitudinal member 256A is overlap of the gate conductor 256A with the periphery of the active area and the STI boundary 254. As with the other embodiments of the present invention, the antifuse structure 250 of FIG. 5 enjoys the advantage that the gate conductor 256 overlies at least a portion of the STI boundary 254 so that low resistance conductive paths between the gate conductor 256 and the active area 252 near the STI boundary 254 will occur upon dielectric breakdown.

Figure 6:
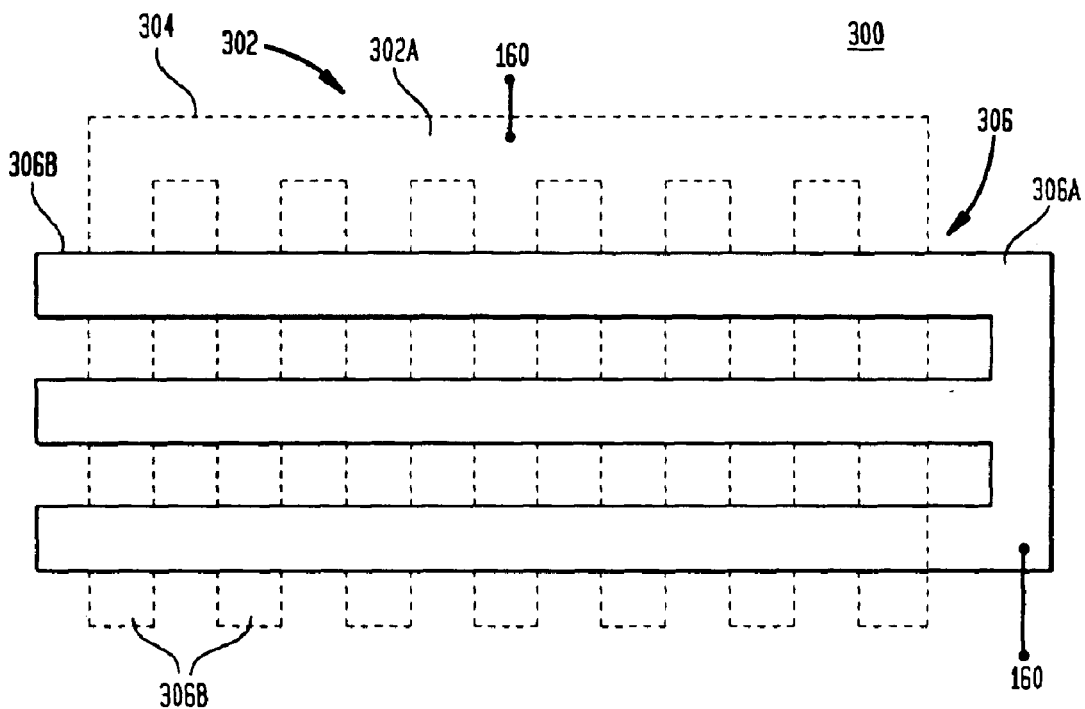
FIG. 6 is a top view of an antifuse element in accordance with one or more still further aspects of the present invention.

FIG. 6 illustrates a further embodiment of the present invention wherein a antifuse structure 300 includes an active area 302 circumscribed by an STI boundary 304, a gate conductor 306, and a dielectric layer (not shown) disposed therebetween. An active area 302 of the semiconductor substrate includes a longitudinal member 302A and a plurality of finger portions 302B extending transversely from the longitudinal member 302A. The gate conductor 306 includes a longitudinal member 306A and a plurality of finger portions 306B extending transversely from the longitudinal member 306A.

The finger portions 302B of the active area 302 are transverse to the finger portions 306B of the gate conductor 306. The advantage of this arrangement is to maximize the extent of the overlap between the STI boundaries 304 and the edge of the gate conductor fingers 306B where the magnitude of the electric field is maximized. As with the other embodiments of the inventions, the antifuse structure 300 enjoys the advantage of substantial overlap of the gate conductor 306 and portions of the STI boundary 304. Accordingly, after breakdown of the dielectric, relatively low resistance paths will exist between the gate conductor 306 and regions of the active area 302 near the STI boundary 304.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. An antifuse, comprising:

a semiconductor substrate having an active area circumscribed by a shallow trench isolation (STI) boundary;

a gate conductor disposed above the semiconductor substrate and overlying at least a portion of the STI boundary;

a dielectric disposed between the semiconductor substrate and the gate conductor;

a first terminal coupled to the gate conductor; and a second terminal coupled to the semiconductor substrate, wherein a breakdown of the dielectric causes electrical connections between regions of the gate conductor and regions of the active area including substantially near the STI boundary.

2. The antifuse of claim 1, wherein the gate conductor completely overlies the active area of the semiconductor substrate.

3. The antifuse of claim 1, wherein the gate conductor overlies only a portion of the active area of the semiconductor substrate.

4. The antifuse of claim 1, wherein the active area of the semiconductor substrate as circumscribed by the STI boundary includes a longitudinal member and a plurality of finger portions extending transversely to the longitudinal member such that the gate conductor overlies at least a portion of at least some of the finger portions.

5. The antifuse of claim 4, wherein the gate conductor is substantially rectangular in shape.

6. The antifuse of claim 1, wherein the gate conductor includes a longitudinal member and a plurality of finger portions extending transversely to the longitudinal member.

7. The antifuse of claim 6, wherein the active area of the semiconductor substrate is substantially rectangular in shape.

8. An antifuse, comprising:

a semiconductor substrate having an active area circumscribed by a shallow trench isolation (STI) boundary, wherein the active area of the semiconductor substrate includes a longitudinal member and a plurality of finger portions extending transversely to the longitudinal member;

a gate conductor having a longitudinal member and a plurality of finger portions extending transversely to the longitudinal member, wherein the gate conductor is disposed above the semiconductor substrate such that at least some of the finger portions of the gate conductor overly at least some portions of the STI boundary;

a dielectric disposed between the semiconductor substrate and the gate conductor;

a first terminal coupled to the gate conductor; and a second terminal coupled to the semiconductor substrate, wherein a breakdown of the dielectric causes electrical connections between regions of the gate conductor and regions of the active area including substantially near the STI boundary.

9. The antifuse of claim 8, wherein the gate conductor completely overlies the active area of the semiconductor substrate.

10. The antifuse of claim 8, wherein the gate conductor overlies only a portion of the active area of the semiconductor substrate.

11. The antifuse of claim 10, wherein the finger portions of the gate conductor are transverse to the finger portions of the active area of the semiconductor substrate.

* * * * *